United States Patent
Flachowsky et al.

(10) Patent No.: US 9,391,176 B2
(45) Date of Patent: Jul. 12, 2016

(54) MULTI-GATE FETS HAVING CORRUGATED SEMICONDUCTOR STACKS AND METHOD OF FORMING THE SAME

(71) Applicant: GLOBALFOUNDRIES Inc., Grand Cayman (KY)

(72) Inventors: Stefan Flachowsky, Dresden (DE); Jan Hoentschel, Dresden (DE); Ralf Richter, Radebeul (DE); Peter Javorka, Radeburg (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/522,000

(22) Filed: Oct. 23, 2014

(65) Prior Publication Data

US 2016/0118483 A1    Apr. 28, 2016

(51) Int. Cl.
| | |
|---|---|
| *H01L 25/00* | (2006.01) |
| *H01L 29/06* | (2006.01) |
| *H01L 29/78* | (2006.01) |
| *H01L 29/40* | (2006.01) |
| *H01L 29/66* | (2006.01) |
| *H01L 29/165* | (2006.01) |
| *H01L 25/065* | (2006.01) |
| *H01L 29/786* | (2006.01) |
| *H01L 29/423* | (2006.01) |

(52) U.S. Cl.
CPC ........ *H01L 29/66818* (2013.01); *H01L 29/165* (2013.01); *H01L 29/66545* (2013.01); *H01L 29/785* (2013.01); *H01L 25/0657* (2013.01); *H01L 29/0634* (2013.01); *H01L 29/42376* (2013.01); *H01L 29/78645* (2013.01); *H01L 29/78648* (2013.01)

(58) Field of Classification Search
CPC ............ H01L 25/0657; H01L 29/0634; H01L 29/78645; H01L 29/78648; H01L 29/42376
See application file for complete search history.

(56) References Cited

U.S. PATENT DOCUMENTS

| | | | | |
|---|---|---|---|---|
| 7,224,015 | B1* | 5/2007 | Skotnicki ........ | H01L 27/10817 257/306 |
| 7,518,195 | B2* | 4/2009 | Ernst ............... | H01L 29/42384 257/347 |
| 8,415,674 | B2* | 4/2013 | Lim ................ | H01L 21/28556 257/67 |
| 8,872,256 | B2* | 10/2014 | Lee ................. | H01L 27/1052 257/326 |
| 8,877,591 | B2* | 11/2014 | Choe et al. .................. | 438/270 |
| 9,202,819 | B2* | 12/2015 | Lee ................. | H01L 27/1052 |
| 2002/0045314 | A1* | 4/2002 | Thakur et al. .............. | 438/255 |
| 2004/0166635 | A1* | 8/2004 | Sun et al. ................... | 438/270 |
| 2005/0184316 | A1* | 8/2005 | Kim ................ | H01L 29/66795 257/213 |
| 2007/0029586 | A1* | 2/2007 | Orlowski .......... | B82Y 10/00 257/287 |
| 2010/0059807 | A1* | 3/2010 | Cho ................ | H01L 27/10814 257/306 |
| 2010/0155810 | A1* | 6/2010 | Kim et al. ................... | 257/316 |
| 2012/0003828 | A1* | 1/2012 | Chang et al. ............... | 438/591 |
| 2012/0064681 | A1* | 3/2012 | Kim et al. ................... | 438/264 |
| 2012/0083077 | A1* | 4/2012 | Yang et al. ................. | 438/156 |
| 2012/0085990 | A1* | 4/2012 | Kryskowski ...... | B82Y 20/00 257/21 |
| 2013/0134492 | A1* | 5/2013 | Yang et al. ................. | 257/314 |
| 2013/0134493 | A1* | 5/2013 | Eom ............... | H01L 29/7926 257/314 |
| 2013/0270643 | A1* | 10/2013 | Lee et al. ................... | 257/365 |
| 2013/0342098 | A1* | 12/2013 | Holland et al. ............ | 313/310 |
| 2014/0134839 | A1* | 5/2014 | Kim ................ | H01L 29/4236 438/652 |
| 2015/0171098 | A1* | 6/2015 | Simsek-Ege et al. ....... | 257/365 |
| 2016/0049346 | A1* | 2/2016 | Shim ............... | H01L 27/11551 257/314 |

FOREIGN PATENT DOCUMENTS

JP          05090488 A  *  4/1993

* cited by examiner

*Primary Examiner* — Ida M Soward
(74) *Attorney, Agent, or Firm* — Amerson Law Firm, PLLC

(57) ABSTRACT

The present disclosure provides, in various aspects of the present disclosure, a semiconductor device which includes a semiconductor stack disposed over a surface of a substrate and a gate structure partially formed over an upper surface and two opposing sidewall surfaces of the semiconductor stack, wherein the semiconductor stack includes an alternating arrangement of at least two layers formed by a first semiconductor material and a second semiconductor material which is different from the first semiconductor material.

17 Claims, 2 Drawing Sheets

MULTI-GATE FETS HAVING CORRUGATED SEMICONDUCTOR STACKS AND METHOD OF FORMING THE SAME

BACKGROUND OF THE INVENTION

1. Field of the Invention

The present disclosure generally relates to multi-gate FETs and to a method of forming such a FET, and, more particularly, to advanced multi-gate FETs, e.g., NW FETs or FinFETs, connected in parallel, and to a method of forming such a FET.

2. Description of the Related Art

In modern electronic technologies, integrated circuits (ICs) experience a vast applicability in a continuously spreading range of applications. Particularly, the ongoing demand for increasing mobility of electronic devices at high performance and low energy consumption drives developments to more and more compact devices having features with sizes significantly smaller than one micrometer, the more so as current semiconductor technologies are apt of producing structures with dimensions in the magnitude of 100 nm or less. With ICs representing a set of electronic circuit elements integrated on a semiconductor material, normally silicon, ICs can be made much smaller than any discreet circuit composed of independent circuit components. Indeed, the majority of present-day ICs are implemented by using a plurality of circuit elements, such as field effect transistors (FETs), also called metal oxide semiconductor field effect transistors (MOSFETs or simply MOS transistors) and passive elements, such as resistors and capacitors, integrated on a semiconductor substrate with a given surface area, wherein typical present-day ICs involve millions of single circuit elements formed on a semiconductor substrate.

The basic function of a FET is that of an electronic switching element, controlling a current through a channel region between two junction regions, referred to as source and drain, by a gate electrode, which is disposed over the channel region and to which a voltage relative to source and drain is applied. In common FETs, the channel region extends along a plane between the source and drain regions, such FETs often being referred to as "planar FETs." Generally, in applying a voltage exceeding a characteristic voltage level to the gate electrode, the conductivity state of the channel is changed and switching between a conducting state or "ON state" and a non-conducting state or "OFF state" may be achieved. It is important to note that the characteristic voltage level at which the conductivity state changes (usually called "the threshold voltage"), therefore, characterizes the switching behavior of the FET and it is an issue to keep variations in the threshold value level low for implementing a well-defined switching characteristic. However, as the threshold voltage depends nontrivially on the transistor's properties, e.g., materials, dimensions etc., the implementation of a desired threshold voltage value during fabrication processes involves careful adjustment and fine-tuning during the fabrication process, which makes the fabrication of advanced semiconductor devices increasingly complex.

For several decades during which the size of individual FETs has steadily decreased, planar transistors represented the core building blocks of ICs. However, with FETs steadily decreasing in size, it was observed that planar FETs more and more suffer from undesirable effects once the channel length of a FET entered the same order of magnitude as the width of the depletion layer of the source/drain regions. For strongly scaled FETs, for example, the OFF state leakage current (i.e., the leakage current during the OFF state) increased with the idle power required by the device. Accordingly, these deteriorating effects appearing at small scales and being associated with short channel lengths are frequently referred to as so-called "short-channel effects."

As opposed to planar FETs, in which the channel region substantially extends in a single plane between the source and drain regions and on which plane a single gate electrode is disposed, the channel region of multi-gate transistors has a multi-dimensional configuration, where the channel region is surrounded by a gate disposed over more than one surface. In general, multi-gate transistors provide a better electrical control over the channel, allowing a more effective suppression of OFF state leakage currents. On the other hand, multi-gate transistors have an enhanced current in the ON state such that lower power consumption and enhanced device performance may be achieved by employing multi-gate transistors. Furthermore, as multi-gate transistors represent non-planar devices, it is even possible to fabricate more compact devices in comparison to conventional planar transistors, therefore, enabling higher transistor density and smaller overall microelectronic devices.

An example of a multi-gate transistor is given by a FinFET device in which a fin-like structure formed of semiconductor material extends between source and drain junctions, while a gate electrode is partially wrapped around the fin-like structure. The fin-like structure generally has a cross-section similar to a triangle or rectangle. A so-called dual gate configuration is realized upon the gate electrode being disposed over two opposing sidewalls of the fin-like structure. A so-called tri-gate configuration is realized upon the gate electrode being formed over two opposing sidewall surfaces and an upper surface of the fin-like structure.

Another possibility of multi-gate transistors is provided by nanowire (NW) transistors or NW FETs. In NW transistors, a current flows through the nanowire or is pinched off under the control of a voltage applied to a gate electrode surrounding the nanowire. With the nanowire providing the channel of the NW transistor, a so-called "gate all around" transistor is realized. However, due to the small size of the nanowire, single nanowires in general do not carry enough current to represent an efficient transistor. Therefore, a structure consisting of an array of several (up to 225) doped silicon nanowires, each 30 nm in diameter and 200 nm tall, vertically linking two platinum contact planes for forming source and drain junctions of the transistor, was proposed. Herein, besides having a narrow arrangement of nanowires, a single 40 nm-thick chromium layer surrounding each nanowire midway up its length was used for forming the gate electrode.

It turned out that, for current strongly-scaled semiconductor devices, a very high number of nanowires have to be connected in parallel in order to provide a high enough total amount of drive current, which may not be provided by presently-known NW transistors. The reason is that the total amount of current available for operation is substantially limited by the small dimensions of the nanowire. For strongly-scaled semiconductor devices formed by multiple nanowires, there is, at the moment, no reliable method/process available to place a plurality of nanowires close to each other with a high enough accuracy to allow for a strongly-scaled semiconductor device providing a high enough total drive current.

Therefore it is desirable to provide an advanced semiconductor device and a method of forming an according semiconductor device, wherein at least one of the above-described issues are addressed, if not avoided.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In accordance with one aspect of the present disclosure, a semiconductor device is provided. According to some illustrative embodiments herein, the semiconductor device may include a semiconductor stack disposed over a surface of a substrate and a gate structure partially formed over an upper surface and two opposing sidewall surfaces of the semiconductor stack, wherein the semiconductor stack includes an alternating arrangement of at least two layers formed by a first semiconductor material and a second semiconductor material which is substantially different from the first semiconductor material.

In accordance with another aspect of the present disclosure, a semiconductor device is provided. In accordance with some illustrative embodiments herein, the semiconductor device may include a corrugated semiconductor stack disposed over a surface of a substrate, the semiconductor stack including an alternating arrangement of at least two layers formed by a first semiconductor material and of at least one layer formed by a second semiconductor material which is substantially different from the first semiconductor material, and a gate structure partially formed over an upper surface and two opposing sidewall surfaces of the semiconductor stack. Herein, the at least one layer formed by the second semiconductor material is trimmed back relative to the at least two layers formed by the first semiconductor material such that corrugations are formed by the second semiconductor material adjacent to the first semiconductor material.

In accordance with still another aspect of the present disclosure, a method of forming a semiconductor device is provided. In accordance with some illustrative embodiments herein, the method includes forming a semiconductor stack over a substrate, the semiconductor stack including an alternating arrangement of at least one layer of a first semiconductor material and at least one layer of a second semiconductor material which is substantially different from the first semiconductor material, and forming a gate structure over the semiconductor stack, wherein the gate structure partially covers an upper surface and opposing sidewalls of the semiconductor stack.

BRIEF DESCRIPTION OF THE DRAWINGS

The disclosure may be understood by reference to the following description taken in conjunction with the accompanying drawings, in which like reference numerals identify like elements, and in which.

Figure 1A:
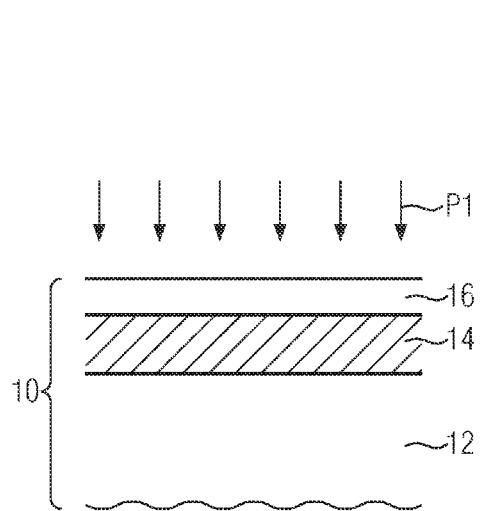
FIGS. 1a-1c schematically illustrate, in cross-sectional views, a process flow in accordance with some illustrative embodiments of the present disclosure, wherein a semiconductor stack having an alternating arrangement of different semiconductor material layers is provided.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure relates to semiconductor circuit elements comprising semiconductor devices that are integrated on or in a chip, such as FETs, e.g., MOSFETs or MOS devices. When referring to MOS devices, the person skilled in the art will appreciate that, although the expression "MOS device" is used, no limitation to a metal-containing gate material and/or to an oxide-containing gate dielectric material is intended.

Semiconductor circuit elements of the present disclosure, and particularly semiconductor devices as illustrated by means of some illustrative embodiments, concern elements and devices which are fabricated by using advanced technologies. Semiconductor circuit elements of the present disclosure are fabricated by technologies applied to approach technology nodes smaller than 100 nm, for example smaller than 50 nm or smaller than 35 nm, i.e., ground rules smaller or equal to 45 nm may be imposed. The person skilled in the art will appreciate that the present disclosure suggests semiconductor circuit elements having structures with minimal length and/or width dimensions smaller than 100 nm, for example smaller than 50 nm or smaller than 35 nm. For example, the present disclosure may provide for semiconductor devices fabricated by using 45 nm technologies or below, e.g., 28 nm or below.

The person skilled in the art understands that semiconductor devices may be fabricated as MOS devices, such as P-channel MOS transistors or PMOS transistors and N-channel transistors or NMOS transistors, and both may be fabricated with or without mobility-enhancing stressor features or strain-inducing features. A circuit designer can mix and match device types, using PMOS and NMOS devices, stressed and unstressed, to take advantage of the best characteristics of each device type as they best suit the semiconductor circuit element being designed.

With regard to the FIGS. 1a-1c, some illustrative embodiments of the present disclosure will be described. FIG. 1a schematically illustrates in a cross-sectional view a silicon-on-insulator configuration (SOI) 10 comprising a semiconductor substrate 12 on which a buried insulating material layer 14 is formed, on which in turn an active layer 16 of semiconductor material is provided. Alternatively, a bulk configuration may be employed, wherein the insulating material layer 14 is formed on the bulk substrate 12 and a semiconductor material layer 16 is formed on the insulating material layer 14.

The person skilled in the art will appreciate that the semiconductor substrate 12 may be, for example, a bulk substrate or represent an active layer of a silicon-on-insulator (SOI) substrate or of a silicon/germanium-on-insulator (SGOI) substrate. In general, the terms "substrate," "semiconductor substrate" or "semiconducting substrate" should be understood to cover all semiconductor materials in all forms of such semiconductor materials and no limitation to a special kind of substrate is intended. The buried insulating material layer 14 may be a buried oxide layer, such as a BOX layer. The semiconductor material layer 16 may be a semiconductor material on the basis of silicon and/or germanium.

During further processing, the substrate configuration 10 may be exposed to a process P1. In accordance with some illustrative embodiments of the present disclosure, the process P1 may comprise at least one deposition process for depositing at least one further semiconductor material layer on the semiconductor material layer 16. In some special illustrative example herein, the process P1 may comprise at least one epitaxial growth process for growing one of an amorphous semiconductor material and a crystalline semiconductor material layer.

Figure 1B:
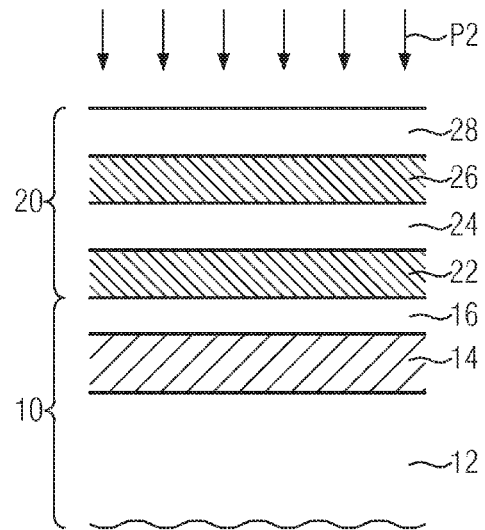

With reference to FIG. 1b, the substrate configuration 10 is schematically illustrated in a cross-sectional view after the process P1 is completed. Herein, a stack 20 of alternating layers is deposited on the semiconductor material layer 16, wherein a first additional semiconductor material layer 22 may be disposed on the semiconductor material layer 16. A second additional semiconductor material layer 24 may be disposed on the first additional semiconductor material layer 22. A third additional semiconductor layer 26 may be disposed on the second additional semiconductor material layer 24. A fourth additional semiconductor material layer 28 may be disposed on the third additional semiconductor material layer 26.

In some illustrative embodiments, the stack 20 may be formed by depositing at least one further semiconductor material different from the material of the semiconductor material layer 16 to form the stack 20 of alternative material layers. In some special illustrative examples herein, the first additional semiconductor material layer 22 and the third additional semiconductor material layer 26 may be formed by the same material, while the second additional semiconductor material layer 24 and the fourth additional semiconductor material layer 28 may be formed by the same material as the semiconductor material layer 16. However, this does not pose any limitation to the present disclosure and the person skilled in the art will appreciate that up to four different semiconductor materials may be chosen for forming the stack 20 such that an alternating arrangement may be provided for the stack 20.

In accordance with some illustrative embodiments herein, the semiconductor material of at least two semiconductor material layers of the semiconductor material layers 16 to 28 may be different in at least one of a crystallographic orientation and an etch rate when etched by an etchant and the species comprised by the semiconductor materials.

Although FIG. 1b explicitly depicts four additional semiconductor layers, the person skilled in the art will appreciate that no limitation of the present disclosure is intended and that, in general, at least one additional material layer (i.e., one additional material layer or more than one additional material layer) may be provided over the semiconductor material layer 16.

In accordance with some illustrative embodiments of the present disclosure, a process P2 may be subsequently performed. The process P2 may comprise a patterning of the stack 20 of alternating layers such that a semiconductor stack 30 (FIG. 1c) is obtained.

In accordance with some illustrative embodiments of the present disclosure, the stack 20 of alternating materials may be formed by two different materials which are deposited during the process P1 in an alternating sequence. In accordance with some illustrative examples herein, the two different materials may be selected such that at least one of the two different materials may be selectively etched relative to the semiconductor material layer 16, e.g., at a substantially faster etch rate. Accordingly, the alternating sequence of the process P1 is chosen such that the semiconductor material having, for example, a relatively faster etch rate is deposited on the semiconductor material layer 16 having, for example, a relatively slower etch rate. The further additional semiconductor material layers of the stack 20 may then be deposited in an alternating sequence. In some special illustrative examples herein, the material of the semiconductor material layer 16 may be silicon, while the material of the at least one additional semiconductor material layer of the stack 20 with the faster etch rate comprises germanium, such as SiGe.

The person skilled in the art will appreciate that the term "relatively faster" is to be understood such that a semiconductor material of at least one of the semiconductor material layers 16 to 28 has an etch rate that is substantially faster than an etch rate of at least one other semiconductor material of at least one other semiconductor material layer of the semiconductor material layers 16 to 28. Accordingly, the term "relatively slower" is to be understood such that a semiconductor material of at least one of the semiconductor material layers 16 to 28 has an etch rate that is substantially slower than an etch rate of at least one other semiconductor material of at least one other semiconductor material layer of the semiconductor material layers 16 to 28.

In some illustrative embodiments of the present disclosure, the thickness of the individual layers 16, 22, 24, 26 and 28 may be in the range from about 50 Å (or 5 nm) to about 200 Å (or 20 nm). In accordance with some illustrative examples herein, the thickness of each layer may be equal. However, this does not pose any limitation to the present disclosure and at least one of the additional layers may have a different thickness than the semiconductor material layer 16. For example, at least one of the additional semiconductor material layers 22, 24, 26 and 28 may be twice as thick as the semiconductor material layer 16. Additionally or alternatively, at least one of the additional semiconductor material layers 22, 24, 26 and 28 may have a different thickness than the other layer(s) of the stack 20. For example, at least one of the additional semiconductor layers 24 and 28 may be twice as thick as at least one of the additional semiconductor material layers 22 and 26. The person skilled in the art will appreciate that the chosen thickness and/or number of layers in the stack 20 may be selected as a trade-off with regard to variability and process capability, on the one hand, and gate field distribution and, therefore, electrostatic behavior of the device under fabrication, on the other hand. In accordance with some illustrative embodiments of the present disclosure, the number of additional semiconductor material layers 22 to 28 in the stack 20 may be in the range from 2 to 30, such as, for example, in the range from 2 to 20 or, for example, in the range from 2 to 10.

In accordance with some illustrative embodiments of the present disclosure, a ratio of thickness for at least two layers of the stack 20 may be equal to about 1 or more. In some explicit examples herein, the ratio may be one of about 1.5 or more and about 2 or more and about 2.5 or more and about 3 or more and about 5 or more and about 10 or more. In some illustrative examples, the ratio may be defined by at least one layer of a first material and at least one layer of a second material. For example, the ratio of more than one layer of a first material to more than one layer of a second material may be taken as the ratio of an average thickness of the more than one layer of the first material to an average thickness of the more than one layer of the second material.

Figure 1C:
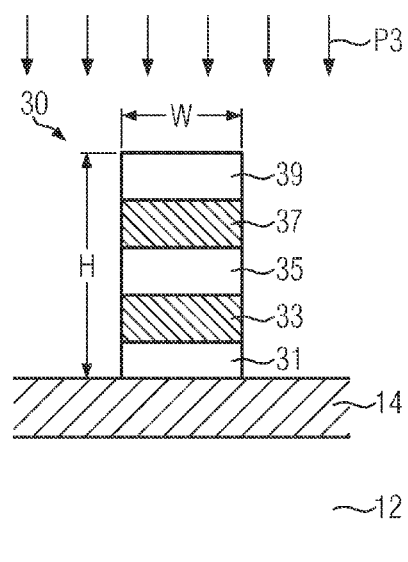

FIG. 1c schematically illustrates a semiconductor stack 30 obtained after exposing the stack 20 in FIG. 1b to the process P2. In some illustrative embodiments herein, the process P2 (FIG. 1b), comprises at least one anisotropic etch process in which the stack 20 of alternating semiconductor layers (FIG. 1b) is anisotropically etched to form the semiconductor stack 30 as depicted in FIG. 1c. In some special illustrative examples herein, a number of anisotropic etch processes may substantially correspond to the number of alternating semiconductor layers in the stack 20 (FIG. 1b).

In accordance with some illustrative embodiments of the present disclosure, a patterning of the stack 20 of semiconductor layers (FIG. 1b) by an appropriate masking pattern (not illustrated) may be performed as part of process P2 to appropriately mask the stack 20 of semiconductor layers (FIG. 1b) with the appropriate masking pattern (not illustrated) such that the semiconductor stack 30 is obtained after the process P2 is completed. In accordance with some illustrative embodiments of the present disclosure, the process P2 may further comprise a cleaning process for removing the masking pattern (not illustrated) from above the semiconductor stack 30 after the at least one anisotropic etch process.

The accordingly-formed semiconductor stack 30 is composed of patterned semiconductor layers 31, 33, 35, 37 and 39 which correspond to the respective layers of semiconductor material 16, 22, 24, 26 and 28 of the alternating arrangement in the stack 20 of semiconductor material layers (FIG. 1b). Particularly, the lowermost patterned layer 31 is obtained by anisotropically etching the semiconductor material layer 16 in the process P2 of FIG. 1b. However, this does not pose any limitation to the present disclosure and the person skilled in the art will appreciate that the semiconductor stack 30 may be obtained by anisotropically etching the uppermost layer 28 (FIG. 1b). Alternatively or additionally, the uppermost layer 39 together with the patterned layer 37 may be obtained by anisotropically etching the uppermost layer 28 and the layer 26 of FIG. 1b. Alternatively or additionally, the uppermost layer 39 together with the patterned layers 37, 35 may be obtained by anisotropically etching the uppermost layer 28 and the layers 26 and 24 in FIG. 1b. Alternatively or additionally, the uppermost layer 39 together with the patterned layers 37, 35, 33 may be obtained by anisotropically etching the layers 28, 26, 24 and 22 in FIG. 1b. In some special illustrative example herein, the insulating material layer 14 may represent an etch stop for the anisotropic etching during the process P2.

As depicted in FIG. 1c, the semiconductor stack 30 may have a width dimension W and a height dimension H, as it is illustrated in FIG. 1c by respective arrows. Particularly, the width dimension W and the height dimension H may be substantially perpendicular to each other. For example, the height dimension H may extend along a normal direction of an upper surface of the insulating material layer 14. It is noted that a length dimension (not illustrated in the cross-sectional view depicted of FIG. 1c) may be substantially perpendicular to the width dimension W and the height dimension H. In some illustrative embodiments of the present disclosure, the width dimension W of the semiconductor stack 30 may be substantially smaller than the height dimension H of the semiconductor stack 30. In a special example herein, an aspect ratio between the width dimension W and the height dimension H may be substantially smaller than one, i.e., W/H<1. In accordance with some illustrative examples herein, the aspect ratio may fulfill: W/H<0.75 or W/H<0.5 or W/H<⅓ or W/H<¼. In accordance with a special illustrative example of the present disclosure, the aspect ratio W/H may be substantially equal to or smaller than 0.1.

In accordance with some illustrative embodiments of the present disclosure, the height dimension H may be in a range from about 100 Å (or 10 nm) to about 2000 Å (or 200 nm). In accordance with some special illustrative examples herein, the height dimension may be in a range from about 10 nm to about 50 nm.

In accordance with some illustrative embodiments of the present disclosure, the height dimension H of the stack 30 may be related to a thickness of at least one of the layers 31 to 39. For example, let d be the thickness of at least one of the layers 31 to 39, then the height dimension H may be about: $H = n*d + m*d/2$, where $N = n + m$ is the total number of layers in the stack 30 (here: N=5 for the layers 31 to 39).

With regard to FIGS. 2a-2c, some further illustrative embodiments of the present disclosure will be described. The person skilled in the art will appreciate that the steps described with regard to FIGS. 2a-2c below are optional and may be omitted in some illustrative embodiments of the present disclosure.

Figure 2A:
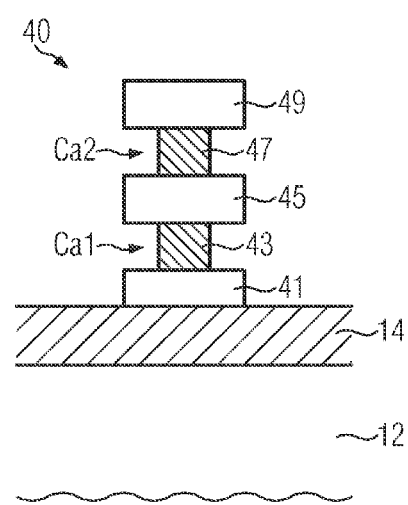
FIGS. 2a-2c schematically illustrate, in cross-sectional views, various alternative implementations of a semiconductor stack in accordance with various alternative embodiments of the present disclosure.

With reference to FIG. 2a, a process P3 may be subsequently performed. In accordance with some illustrative embodiments of the present disclosure, the process P3 (FIG. 1c) may comprise a selective etching process applied to the semiconductor stack 30, wherein at least one of the patterned layers 31 to 39 is selectively etched relative to the other patterned layers. In a special illustrative example herein, as depicted in FIG. 1c, the patterned layers 33 and 37 may be selectively etched relative to the patterned layers 31, 35 and 39.

In accordance with some illustrative embodiments of the present disclosure, the process P3 may comprise a timed isotropic etch process which may be configured such that the materials of the patterned layers 33 and 37 are etched at a faster etch rate than the patterned layers 31, 35 and 39. In accordance with some illustrative examples herein, the etch rates for etching the patterned layers 33 and 37 may be such that 10% or more (relative to at least one of at least one geometric dimension, volume, weight, amount, etc.), e.g., at least 20% or at least 25%, of the patterned layers 31, 35 are etched during the process P3, while at most 10% (relative to at least one of at least one geometric dimension, volume, weight, amount, etc.), e.g., at most 5% or at most 1%, of the patterned layers 31, 35, 39 is etched. In a special illustrative example herein, the patterned layers 31, 35 and 39 may be formed by silicon and the patterned layers 33 and 37 may be formed by silicon/germanium. Herein, the process P3 may comprise a sequence of using one of a TMAH and KOH etchant which etches silicon/germanium faster than silicon. In choosing an appropriate timing for the application of the etchant, e.g., a short time duration, such as 10 seconds or less, a significant etching of the patterned layer 33 and 37 in comparison to the patterned layer 31, 35 and 39 may be achieved. In accordance with some illustrative embodiments of the present disclosure, an etch rate may be of about 5 nm/s. The person skilled in the art will appreciate that a time duration and, accordingly, an etch rate may depend on the temperature of an etchant employed during the process P3, i.e., an etch rate may be smaller at lower temperatures and higher at higher temperatures.

As it is schematically illustrated in FIG. 2a in a cross-sectional view, a corrugated semiconductor stack 40 may be obtained in accordance with some illustrative embodiments of the present disclosure after the process P3 is completed. The corrugated semiconductor stack 40 may be disposed over an upper surface of the insulating material layer 14. As depicted in FIG. 2a, the corrugated semiconductor stack 40 comprises an alternating arrangement of at least two layers (here in the depiction of FIG. 2a, the layers 41, 45 and 49) formed by a first semiconductor material (e.g., silicon or the like), and at least one layer (here in the illustration of FIG. 2a, the layers 43 and 47) formed by a second semiconductor material (e.g., silicon-germanium), which is different from the first semiconductor material. As illustrated in FIG. 2a, the at least one layer (in the illustration of FIG. 2a, the layers 43 and 47) formed by the second semiconductor material is trimmed back relative to the at least two layers (in the illustration of FIG. 2a, the layers 41, 45 and 49) formed by the first semiconductor material such that at least one corrugation (in the illustration of FIG. 2a, corrugations Ca1 and Ca2) is formed by the second semiconductor material.

Reference is made to FIG. 2a. The person skilled in the art will appreciate that the cross-sectional shape of the corrugations Ca1, Ca2 depends on the etchant employed during the process P3 in FIG. 1c. As illustrated in FIG. 2a, corrugations of a substantially rectangular shape may be obtained.

Figure 2B:
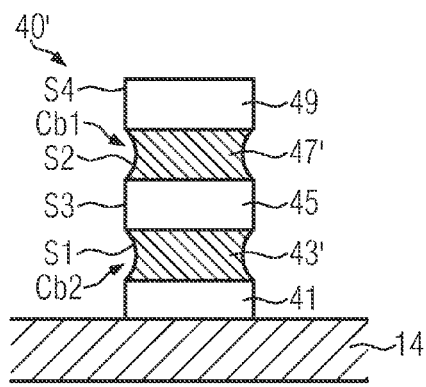

FIG. 2b schematically illustrates, in a cross-sectional view, a semiconductor stack 40' in accordance with some alternative embodiments of the present disclosure. Herein, the patterned layers 31 to 39 of the semiconductor stack 30 in FIG. 1c were exposed to a process P3 resulting in the semiconductor stack 40', particularly in the patterned layers 43' and 47' instead of the patterned layers 43 and 47 as illustrated in FIG. 2a. Herein, corrugations Cb1 and Cb2 are formed which have a curved surface S1, S2 relative to the sidewall surfaces S3 and S4 of the patterned layers 45 and 49. The person skilled in the art will appreciate that due to the curved corrugations Cb1 and Cb2, sharp corners may be avoided, resulting in an improved reliability of the device under fabrication because electrical field peaks in the corrugated semiconductor stack 40' are avoided.

Figure 2C:
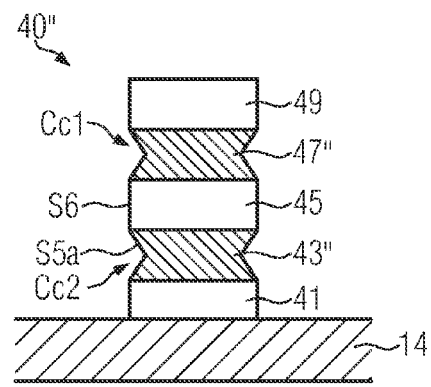

A further alternative embodiment of the present disclosure is illustrated in FIG. 2c. In employing a sigma-etch configuration during the process P3 in FIG. 1c, a corrugated semiconductor stack 40", as illustrated in FIG. 2c, may be obtained. The person skilled in the art will appreciate that the patterned layers 31 to 39 of the semiconductor stack 30 in FIG. 1c were exposed to a process P3 resulting in the semiconductor stack 40", particularly in the patterned layers 43" and 47" instead of the patterned layers 43 and 47, as illustrated in FIG. 2a, and the layers 43' and 47' depicted in FIG. 2b. According to the process P3 in this illustrative embodiment, sigma-shaped corrugations Cc1 and Cc2 are formed. In some illustrative examples herein, the sigma-shaped corrugations Cc1 and Cc2 may be obtained by employing an etch process for etching silicon/germanium, making use of different etch rates along different crystal planes of silicon/germanium material.

Reference is made to FIG. 2c. In accordance with some illustrative embodiments of the present disclosure, the corrugations Cc1 and Cc2 may have inclined sidewall surface regions, such as depicted in FIG. 2c by the surface regions S5a of the corrugation Cc2, where the inclined sidewall surface regions are beveled relative to sidewall surfaces of the surrounding layers 41, 45 and 49, as illustrated in FIG. 2c by a sidewall surface S6 of the layer 45.

With regard to FIGS. 3a and 3b, further fabrication of a semiconductor device in accordance with some illustrative embodiments of the present disclosure will be further illustrated and explained below. Subsequently to the formation of the corrugated semiconductor stack 40 (or alternatively, one of the alternative semiconductor stacks 40' and 40"), a gate structure 50 may be formed over the insulating material layer 14, the gate structure 50 overlying the corrugated semiconductor stack 40 (or alternatively, one of the alternative semiconductor stack 40' and 40"). The gate structure 50 may comprise a gate insulating structure 52 and a gate electrode structure 54 which may partially enclose a portion of the corrugated semiconductor stack 40. FIG. 3b schematically illustrates a top view of the semiconductor device under fabrication, wherein the gate structure 50 overlies the corrugated semiconductor stack 40 along a transverse direction, i.e., the gate structure 50 extends along the width dimension W (see also FIG. 1c and the according description).

The person skilled in the art will appreciate that the gate structure 50 may be formed during one of a gate-first process and a gate-last process. For example, the gate structure 50 may represent a dummy gate or hybrid gate structure. Alternatively, the gate insulating structure 52 may comprise a high-k material (k value greater than 4 or k value greater than 10) or may comprise a high-k material in combination with a work function adjusting material. The gate electrode structure 54 may represent one of a dummy electrode material and a gate electrode material.

In accordance with some illustrative embodiments of the present disclosure, further processing of the semiconductor device under fabrication may continue in accordance with conventional process flows employed in FinFET or NW FET fabrication by forming source/drain regions and contact structures to the gate electrode and source/drain regions. For example, source/drain regions may be formed in the corrugated semiconductor stack 40 in alignment with the gate structure 50, e.g., by performing an implantation sequence.

Figure 3A:
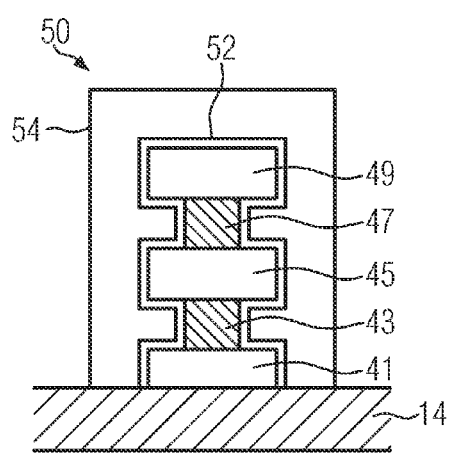
FIGS. 3a and 3b schematically illustrate, in a cross-sectional view (FIG. 3a) and a top-view (FIG. 3b), a semiconductor device, comprising a semiconductor stack in accordance with some illustrative embodiments of the present disclosure.
Figure 3B:
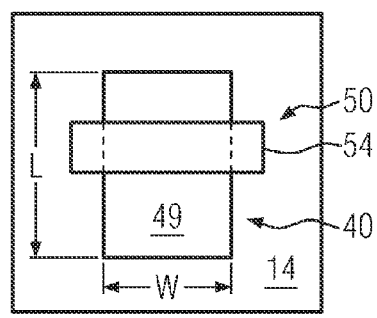

The person skilled in the art will appreciate that the gate structure 50 as illustrated in FIG. 3a surrounds the corrugated or "riffled" semiconductor stack 40 (or alternatively one of the corrugated semiconductor stacks 40' and 40") such that the effective gate length is substantially increased and the electrostatic behavior is improved. In this way, a "nanowire stack" of vertically-extending nanowires, i.e., as provided by the layers 41, 43, 45, 47 and 49 of the corrugated semiconductor stack 40, may be obtained.

Although formation of a corrugated semiconductor stack is described during the fabrication of a semiconductor device, the person skilled in the art will appreciate that the process P3 for forming a corrugated semiconductor stack is optional and may be omitted. For example, the process flow may, in some illustrative embodiments, continue by forming the gate structure 50 (FIG. 3a) over the stack 30 (FIG. 1c) after the process P2 (FIG. 1b) is completed.

The present disclosure provides for a stacked FinFET or nanowire (NW) configuration with a riffled or corrugated surface and a multi-gate transistor architecture which may be employed in FinFET and nanowire technologies at 22 nm and beyond. Herein, due to the FinFET or nanowire technology, next generation transistor concepts with high channel control and better short-channel effect behavior may be obtained based on semiconductor devices provided by the present disclosure. Due to the vertical stack configuration, multiple fins or nanowires may be connected in parallel in order to increase the total drive current of accordingly-formed semiconductor devices. Instead of the conventional formation of vertically extending nanowires in a dense arrangement normal to the surface of a semiconductor substrate, which suffers from the problems of high complication when forming nanowires close to each other, the present disclosure proposes a simple strategy by means of a semiconductor stack of alternating layers of different materials for forming a vertical assembly of "nanowires" or "fins." Further advantages may be obtained by forming a riffled or corrugated surface which allows improvement of the gate control of the vertical assembly of nanowires or fins due to an increased surface by corrugations or riffles in the semiconductor stack.

The person skilled in the art will appreciate that semiconductor devices which are provided by the present disclosure may provide for a high total drive current and may be employable in high speed/high performance applications.

The person skilled in the art will appreciate that, in accordance with some aspects of the present disclosure, some methods of forming a semiconductor device may allow for a self-aligned formation of multiple-nanowires or fins in a vertical arrangement.

In accordance with some illustrative embodiments of the present disclosure, the formation of semiconductor devices may start from an SOI substrate, or alternatively a bulk substrate. Next, an alternating stack of at least two different materials may be deposited over the substrate. Subsequently, the alternating stack may be anisotropically etched to form a "nanowire stack" or "fin stack." After applying an optional selective etching process for selectively etching at least one of the different materials of the alternating stack relative to at least one remaining other material, a corrugated or riffled stack configuration may be obtained. Herein, at least one of the vertical layers of the stack may substantially remain to have a larger dimension than at least one other vertical layer of the stack which may be substantially trimmed during the selective etching. Subsequently, a gate structure may be formed by depositing a high-k dielectric and a gate electrode over the corrugated or riffled stack configuration.

The present disclosure may provide, in one aspect, a semiconductor device comprising a semiconductor stack disposed over a surface of a substrate and a gate structure partially formed over an upper surface and two opposing sidewall surfaces of the semiconductor stack. Herein, the semiconductor stack may comprise an alternating arrangement of at least two layers formed by a first semiconductor material and a second semiconductor material which is substantially different from the first semiconductor material. In accordance with some illustrative embodiments herein, the substrate may have a bulk configuration or an SOI configuration. In some special examples of SOI configurations herein, the semiconductor stack may be formed on an insulating layer of an SOI substrate, e.g., a semiconductor layer provided on the insulating layer of SOI substrates may be comprised by the semiconductor stack.

The present disclosure may provide, in another aspect, a semiconductor device comprising a corrugated semiconductor stack disposed over a surface of a substrate. The semiconductor stack may comprise an alternating arrangement of at least two layers formed by a first semiconductor material and of at least one layer formed by a second semiconductor material which is substantially different from the first semiconductor material, and a gate structure partially formed over an upper surface and two opposing sidewall surfaces of the semiconductor stack. Herein, the at least one layer formed by the second semiconductor material may be trimmed back relative to the at least two layers formed by the first semiconductor material such that corrugations are formed by the second semiconductor material adjacent to the first semiconductor material. In accordance with some illustrative embodiments herein, the substrate may have a bulk or an SOI configuration. In some special examples of SOI configurations herein, the corrugated semiconductor stack may be formed on an insulating layer of an SOI substrate, e.g., a semiconductor layer provided on the insulating layer of SOI substrates may be comprised by the corrugated semiconductor stack.

The present disclosure may provide, in still another aspect, a method of forming a semiconductor device including: forming a semiconductor stack over a substrate, the semiconductor stack comprising an alternating arrangement of at least one layer of a first semiconductor material and at least one layer of a second semiconductor material, and forming a gate structure over the semiconductor stack, wherein the gate structure partially covers an upper surface and opposing sidewalls of the semiconductor stack. In accordance with some illustrative embodiments herein, the substrate may have a bulk or an SOI configuration. In some special examples of SOI configurations herein, the semiconductor stack may be formed on an insulating layer of an SOI substrate, e.g., a semiconductor layer provided on the insulating layer of SOI substrates may be comprised by the semiconductor stack.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
   a corrugated semiconductor stack disposed over a surface of a substrate; and
   a gate structure partially formed over a first portion of an upper surface and second portions of two opposing sidewall surfaces of said corrugated semiconductor stack, wherein a second portion of said upper surface and third portions of said two opposing sidewall surfaces are not covered by said gate structure;
   wherein said corrugated semiconductor stack comprises an alternating arrangement of at least two layers formed of a first semiconductor material and at least one layer of a second semiconductor material positioned vertically between said at least two layers of said first semiconductor material, wherein said second semiconductor material comprises germanium and said first semiconductor material is silicon, and wherein said at least one layer of said second semiconductor material has, relative to said at least two layers of said first semiconductor material, a smaller dimension measured along a direction perpendicular to a normal direction of said upper surface.

2. The semiconductor device of claim 1, wherein sidewall surfaces of said corrugated semiconductor stack formed by said second semiconductor material have one of a curved shape and inclined sidewall surface regions relative to sidewall surfaces formed by said first semiconductor material.

3. The semiconductor device of claim 1, wherein a ratio of a thickness of each of said at least two layers formed of said first semiconductor material to a thickness of said at least one layer of said second semiconductor material is at least about 1.0.

4. The semiconductor device of claim 1, wherein an overall width dimension of said corrugated semiconductor stack measured in a direction perpendicular to a normal direction of said upper surface is substantially smaller than an overall height dimension of said corrugated semiconductor stack measured in a direction parallel to said normal direction.

5. The semiconductor device of claim 4, wherein said overall height dimension is in a range from about 10 nm to about 200 nm.

6. The semiconductor device of claim 5, wherein said overall height dimension is in a range from about 10 nm to about 50 nm.

7. The semiconductor device of claim 1, wherein said corrugated semiconductor stack is formed on an insulating material layer which is provided on the semiconductor substrate.

8. A semiconductor device, comprising:
a corrugated semiconductor stack disposed over a surface of a substrate, said corrugated semiconductor stack comprising an alternating arrangement of at least two layers formed of a first semiconductor material and of at least one layer formed of a second semiconductor material positioned vertically between said at least two layers of said first semiconductor material, wherein said second semiconductor material is substantially different from said first semiconductor material and wherein said first semiconductor material is silicon and said second semiconductor material comprises germanium; and
a gate structure partially formed over an upper surface and two opposing sidewall surfaces of said corrugated semiconductor stack, wherein said at least one layer of said second semiconductor material has, relative to said at least two layers of said first semiconductor material, a smaller dimension measured along a direction perpendicular to a normal direction of said upper surface.

9. The semiconductor device of claim 8, wherein said corrugated semiconductor stack has sidewall surface portions which are defined by sidewall portions of said second semiconductor material having one of a curved shape and inclined sidewall surface regions relative to sidewall surfaces formed by said first semiconductor material.

10. The semiconductor device of claim 8, wherein a ratio of a thickness of each of said at least two layers formed of said first semiconductor material to a thickness of said at least one layer formed of said second semiconductor material is at least about 1.0.

11. A semiconductor device, comprising:
a corrugated semiconductor stack disposed over a surface of a substrate; and
a gate structure partially formed over an upper surface and two opposing sidewall surfaces of said corrugated semiconductor stack;
wherein said corrugated semiconductor stack comprises an alternating arrangement of at least two layers formed of a first semiconductor material and at least one layer of a second semiconductor material positioned vertically between said at least two layers of said first semiconductor material, wherein said second semiconductor material comprises germanium and said first semiconductor material is silicon, and wherein said at least one layer of said second semiconductor material has, relative to said at least two layers of said first semiconductor material, a smaller dimension measured along a direction perpendicular to a normal direction of said upper surface.

12. The semiconductor device of claim 11, wherein sidewall surfaces of said corrugated semiconductor stack formed by said second semiconductor material have one of a curved shape and inclined sidewall surface regions relative to sidewall surfaces formed by said first semiconductor material.

13. The semiconductor device of claim 11, wherein a ratio of a thickness of each of said at least two layers formed of said first semiconductor material to a thickness of said at least one layer of said second semiconductor material is at least about 1.0.

14. The semiconductor device of claim 11, wherein an overall width dimension of said corrugated semiconductor stack measured in a direction perpendicular to a normal direction of said upper surface is substantially smaller than an overall height dimension of said corrugated semiconductor stack measured in a direction parallel to said normal direction.

15. The semiconductor device of claim 14, wherein said overall height dimension is in a range from about 10 nm to about 200 nm.

16. The semiconductor device of claim 15, wherein said overall height dimension is in a range from about 10 nm to about 50 nm.

17. The semiconductor device of claim 11, wherein said corrugated semiconductor stack is formed on an insulating material layer which is provided on the semiconductor substrate.

* * * * *